US012690230B2

(12) United States Patent
Kim et al.

(10) Patent No.: US 12,690,230 B2
(45) Date of Patent: Jul. 21, 2026

(54) SEMICONDUCTOR DEVICE COMPRISING MUTUALLY SEPARATED TRENCH STRUCTURES

(71) Applicant: NEXPERIA B.V., Nijmegen (NL)

(72) Inventors: Hungjin Kim, Nijmegen (NL); Phil Rutter, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 1023 days.

(21) Appl. No.: 17/689,017

(22) Filed: Mar. 8, 2022

(65) Prior Publication Data

US 2022/0285549 A1     Sep. 8, 2022

(30) Foreign Application Priority Data

Mar. 8, 2021     (EP) ..................................... 21161225

(51) Int. Cl.
| | |
|---|---|
| *H10D 30/66* | (2025.01) |
| *H10D 30/01* | (2025.01) |
| *H10D 64/00* | (2025.01) |
| *H10D 64/01* | (2025.01) |

(52) U.S. Cl.
CPC ....... *H10D 30/668* (2025.01); *H10D 30/0297* (2025.01); *H10D 64/01* (2025.01); *H10D 64/117* (2025.01)

(58) Field of Classification Search
CPC ............. H10D 30/668; H10D 30/0297; H10D 64/117; H10D 64/512; H10D 64/513; H10D 64/514; H10D 64/518
USPC ........................................................ 257/330
See application file for complete search history.

(56) References Cited

U.S. PATENT DOCUMENTS

| | | | |
|---|---|---|---|
| 7,385,248 B2 | 6/2008 | Herrick et al. | |
| 8,871,593 B1 | 10/2014 | Siemieniec et al. | |
| 9,680,003 B2 * | 6/2017 | Qin ...................... | H10D 62/393 |
| 9,825,167 B2 * | 11/2017 | Matsuura ............. | H10D 64/671 |

(Continued)

FOREIGN PATENT DOCUMENTS

| | | |
|---|---|---|
| CN | 103855017 B | 8/2016 |
| WO | 2019198800 A1 | 10/2019 |

OTHER PUBLICATIONS

Extended European Search Report for corresponding European application No. 21161225.4, 10 pages, dated Sep. 8, 2021.

*Primary Examiner* — Norman D Richards
(74) *Attorney, Agent, or Firm* — Ruggiero McAllister & McMahon LLC

(57) ABSTRACT

A semiconductor device and method of manufacturing thereof is provided, including one or more mutually separated trench structures and semiconductor devices in which a first polysilicon body and a second polysilicon body are provided in the trenches, and the first and second polysilicon bodies can be individually biased. The method according to the present disclosure includes the step of performing a wet oxidation for oxidizing the first polysilicon body and the exposed upper surface of the sidewall for forming, within the active area, a first part of a second dielectric layer and subsequently performing a dry oxidation for forming a remaining part of the second dielectric layer. A second polysilicon body is arranged next within the active area on the second dielectric layer in the trench so that the second polysilicon body is separated from the sidewall of the trench and from the first polysilicon body by the second dielectric layer.

19 Claims, 7 Drawing Sheets

(56)           References Cited

U.S. PATENT DOCUMENTS

| | | | |
|---|---|---|---|
| 2004/0031987 A1* | 2/2004 | Henninger | H10D 64/117 |
| | | | 257/493 |
| 2013/0302958 A1* | 11/2013 | Hossain | H10D 30/0295 |
| | | | 438/270 |
| 2016/0064556 A1* | 3/2016 | Qin | H10D 64/519 |
| | | | 257/334 |
| 2019/0006479 A1 | 1/2019 | Hsu et al. | |
| 2021/0098346 A1* | 4/2021 | Okuyama | H01L 23/49582 |

* cited by examiner

SEMICONDUCTOR DEVICE COMPRISING MUTUALLY SEPARATED TRENCH STRUCTURES

CROSS REFERENCE TO RELATED APPLICATION

This application claims the benefit under 35 U.S.C. § 119(a) of European Application No. 21161225.4 filed Mar. 8, 2021, the contents of which are incorporated by reference herein in their entirety.

BACKGROUND OF THE DISCLOSURE

1. Field of the Disclosure

The present disclosure relates to a semiconductor device comprising one or more mutually separated trench structures. The present disclosure further relates to a method for manufacturing such a device. The present disclosure particularly relates to semiconductor devices in which a first polysilicon body and a second polysilicon body are provided in the trenches, wherein the first and second polysilicon bodies can be individually biased.

2. Description of the Related Art

A known example of a semiconductor device of the type described above is a shielded gate field-effect transistor, and more in particular a shielded gate metal-oxide-semiconductor field-effect transistor, MOSFET. A further example of a semiconductor device of the type described above is a trench insulated-gate bipolar transistor, IGBT.

A cross-sectional view of a shielded gate MOSFET known from U.S. Pat. No. 7,385,248B2 is shown in FIG. 1. Known MOSFET 10 comprises a polysilicon gate body 1 provided in a trench 2 arranged inside a silicon semiconductor body. As shown in FIG. 1, the silicon semiconductor body comprises an n+ substrate 3 and an n– epitaxial layer 4 that is arranged on substrate 3. Inside epitaxial layer 4, a p body region 5 and an n+ source region 6 are formed by means of ion implantation. The non-implanted region of epitaxial layer 4 is often referred to as drift region. Furthermore, on the bottom of substrate 3, a drain terminal of MOSFET 10 is provided (not shown).

MOSFET 10 comprises a dielectric layer 5A that forms a gate oxide of MOSFET 10 and that separates polysilicon gate body 1 from body region 5. Polysilicon gate body 1 is electrically connected to a gate terminal (not shown). By controlling a charge or voltage on polysilicon gate body 1, a channel can be formed in body region 5 between source region 6 and the drift region, thereby enabling a current flow from the drain terminal of MOSFET 10 to a source terminal (not shown) of MOSFET 10 that is electrically connected to source region 6.

A reduced surface field, RESURF, structure can be used for the purpose of enhancing a breakdown voltage of MOSFET 10. Referring to FIG. 1, the RESURF structure is formed by a dielectric layer 8 arranged on a part of a sidewall and bottom of trench 2 combined with a buried polysilicon shield body 9 inside trench 2. Buried polysilicon shield body 9 is arranged below polysilicon gate body 1 and is separated therefrom by a dielectric layer 9A.

A charge or voltage at buried polysilicon shield body 9 can be controlled to alter the electric field distribution inside the semiconductor device to thereby increase a critical drain-to-source voltage at which the device breaks down.

For example, by biasing buried polysilicon shield body 9 at zero Volts, the RESURF effect is obtained, spreading the drain potentials uniformly across the drift region and thereby creating a rectangular electric field distribution. In addition, buried polysilicon shield body 9 partially shields polysilicon gate body 1 from the drift region, thereby reducing a gate-drain capacitance and, consequently, improving a switching performance of the device.

Dielectric layer 9A between buried polysilicon shield body 9 and polysilicon gate body 1 is configured to electrically isolate the gate from the source. However, at least part of this layer is simultaneously formed with dielectric layer 5A. Quality and thickness control of this layer is therefore of utmost importance. Furthermore, this dielectric layer should be sufficiently thick to prevent excessive gate-to-source leakage currents. In addition, this dielectric layer is strongly related to the gate-source capacitance of the MOSFET due to the close proximity of buried polysilicon shield body 9 and polysilicon gate body 1. A relatively high gate-source capacitance will have a detrimental impact on the switching behaviour of the MOSFET.

SUMMARY

An object of the present disclosure is to provide a method of manufacturing a semiconductor device comprising one or more mutually separated trench structures having an dielectric layer that separates the first polysilicon body and second polysilicon body and that forms an electrically insulating layer between the first polysilicon body and the sidewall of the trench.

According to a first aspect, this object is achieved using the method as defined in claim 1. According to the present disclosure, the method comprises the steps of a) providing one or more spaced apart elongated trenches formed in a semiconductor body, each trench extending through an active area in the semiconductor body, wherein a bottom and a lower portion of a sidewall of each trench are covered by a first dielectric layer, and wherein for each trench a first polysilicon body is arranged in the trench, said first polysilicon body being separated from the bottom and sidewall of the trench by said first dielectric layer, wherein for each trench an upper surface of the first polysilicon body and an upper portion of the sidewall are exposed. The one or more trenches preferably extend in parallel.

The method comprises the additional steps of b) performing a wet thermal oxidation for oxidizing the first polysilicon body and the exposed upper surface of the sidewall for forming, within the active area, a first part of a second dielectric layer and subsequently performing a dry thermal oxidation for forming a remaining part of the second dielectric layer, and c) arranging within the active area a second polysilicon body on the second dielectric layer in each trench such that the second polysilicon body is separated from the sidewall of the trench and from the first polysilicon body by said second dielectric layer.

According to the present disclosure, when forming the second dielectric layer, the electrically insulating layer between the first polysilicon body and the second polysilicon body and the electrically insulating layer between the sidewall of the trench and the second polysilicon body are simultaneously formed as the second dielectric layer. However, due to the difference in oxidation rates between that of the exposed upper portion of the sidewall and that of the exposed upper surface of the first polysilicon body, a difference in thickness between these insulating layers may be obtained. The wet chemical oxidation process allows for much higher oxidation rates to be obtained for the heavily doped first polysilicon bodies than for the exposed upper portions of the sidewalls of the trenches formed in the lowly-doped monocrystalline silicon semiconductor body. The subsequent dry thermal oxidation process removes any residual elements like residual silicon and oxygen in the second dielectric layer on the exposed first polysilicon body, densifies the second dielectric layer itself, and forms a remaining part of the second dielectric layer on the exposed upper portion of the sidewalls.

By adjusting process parameters such as temperature, pressure, gas flow and the like, and the ratio of times corresponding to the dry and wet thermal oxidation processes, a ratio between the thickness of these insulating layers can therefore be controlled. Moreover, the Applicant has found that using this single oxidation process, albeit comprising a dry and wet phase, a high quality dielectric layer can be obtained. Furthermore, the abovementioned independent control of layer thickness allows a higher breakdown voltage and a lowered gate source capacitance to be obtained for the same thickness of the electrically insulating layer between the second polysilicon body and the sidewall of the trench.

For example, an oxidation rate during the wet thermal oxidation of the first polysilicon body can be at least 3 times greater than that of the exposed upper portion of the sidewall of the trench depending on oxidation temperature.

Performing step a) may include performing the steps of a1) providing the one or more spaced apart elongated trenches such that the bottom and the sidewall of each trench are substantially entirely covered by the first dielectric layer, wherein for each trench an upper surface of the first polysilicon body is exposed, and a2) performing thermal oxidation and subsequent oxide deposition to round off the upper surface of the first polysilicon body thereby forming a tapered upper end of the first polysilicon body and to thicken the first dielectric layer. After step a2) the formed oxide layers may be densified in or $N_2$, $N_2/O_2$ ambient.

Performing step a) may include the further steps of a3) arranging a first masking layer, a4) opening the first masking layer within the active area, and a5) etching the first dielectric layer through the opened first masking layer such that the upper portion of the sidewall of each trench becomes exposed and such that the upper end of the first polysilicon body protrudes from the first dielectric layer. Using an increased etching time of the first dielectric layer will determine a height of the upper end of the first polysilicon body that protrudes from the first dielectric layer. In combination with steps b) and c) this preferably results in the upper end protruding into a recess of the second polysilicon body. The recess in the second polysilicon body is shaped as a result of the shape of the second dielectric formed on top of the first polysilicon body.

Performing step a1) may include the steps of a11) providing the one or more spaced apart elongated trenches such that the bottom and the sidewall of each trench and an upper surface of the semiconductor body are covered by the first dielectric layer, and a12) etching the first dielectric layer to expose the upper surface of the semiconductor body.

The semiconductor body may comprise an access area and an intermediate area through which the one or more trenches extend, wherein the intermediate area is arranged in between the access area and the active area. In this case, performing step a11) may comprise performing the steps of a111) providing the one or more spaced apart elongated trenches such that the bottom and the sidewall of each trench and an upper surface of the semiconductor body are covered by the first dielectric layer and wherein the first polysilicon body fills the trench, a112) providing a second masking layer, a113) patterning the second masking layer such that the second masking layer covers those trenches among the one or more trenches that are arranged in the access area, and such that the second masking layer exposes those trenches among the one or more trenches that are arranged in the active area, a114) partially etching the first polysilicon body in the one or more trenches through the opened second masking layer, a115) partially etching, preferably wet etching, the first dielectric layer such that an upper end of the first polysilicon body protrudes from the first dielectric layer, and a116) etching the first polysilicon body. Typically, the second masking layer arranged during step a112) is removed prior to performing step a115).

Step a114) may be performed such that after said etching, the first polysilicon body inside the intermediate area varies from a level corresponding to that of the first polysilicon body inside the active area to a level corresponding to that of the first polysilicon body inside the access area. Additionally or alternatively, step a116) can be performed such that after said etching, the first polysilicon body within the active area lies leveled with the first dielectric layer, and such that after said etching, the first polysilicon body within the access area lies in plane with the upper surface of the semiconductor body.

Step a115) is performed such that a sufficient amount of the first dielectric layer still covers the upper surface of the semiconductor body to protect the semiconductor body during step a116). Furthermore, step a115) and step a116) are important processes for obtaining a desired profile of the first and second polysilicon bodies inside the trench. More in particular, these steps determine an overlapped area between the first and second polysilicon bodies thereby determining a gate-source capacitance.

According to a second aspect, the present disclosure provides a semiconductor device comprising one or more mutually separated trench structures which preferably extend in parallel. Each trench structure comprises an elongated trench formed in a semiconductor body, said trench extending through an active area in the semiconductor body. Each trench structure further comprises a first dielectric layer arranged on a bottom and a lower portion of a sidewall of the trench, a first polysilicon body arranged in the trench and separated from the bottom and sidewall of the trench by said first dielectric layer, a second dielectric layer arranged, within the active area, on an upper portion of a sidewall of the trench, on the first polysilicon body, and on the first dielectric layer, and a second polysilicon body arranged, within the active area, in the trench and separated from the sidewall of the trench and from the first polysilicon body by said second dielectric layer. The second polysilicon body comprises an elongated recess extending along the trench within the active area, said recess being directed to the bottom of the trench. The first polysilicon body has a tapered upper end that extends along the trench within the active area and that partially extends in the recess. A minimum thickness d1 of the second dielectric layer between the upper end and the second polysilicon body is greater than a minimum thickness d2 of the second dielectric layer between the upper portion of the sidewall and the second polysilicon body. Having a tapered end that partially protrudes into the recess, spikes in the electrical field distribution can be prevented, while at the same timing allowing a low gate-source capacitance. Furthermore, according the present disclosure, the entire sidewall of the trench now has nearby polysilicon which provides a reproducible electric field profile along the trench wall where current flows, and which allows for improved reliability and a lower on resistance.

Thickness d1 of the second dielectric layer between the upper end and the second polysilicon body may equal a times the thickness d2 of the second dielectric layer between the upper portion of the sidewall and the second polysilicon body, wherein a>2, more preferably a>3, and/or wherein 2d2>d1>4d2. Furthermore, thickness d2 may lie in a range between 0.02 and 0.2 micrometer, more preferably between 0.03 and 0.07 micrometer.

The first polysilicon body may have a maximum width w1 in a direction perpendicular to a longitudinal axis of the elongated trench. The tapered upper end may in this case have a height h1 in a depth direction of the trench, wherein $$0.3 < \frac{w1}{h1} < 3.$$

Furthermore, width w1 may lie in a range between 0.1 and 2 micrometer.

The first dielectric layer and the second dielectric layer may both be silicon oxide layers. More in particular, the first dielectric layer may comprise a thermally grown silicon oxide layer, and the second dielectric layer may comprise a combination of a wet-thermally grown silicon oxide layer and a dry-thermally grown silicon oxide layer.

The semiconductor body may comprise an access area and an intermediate area through which the trench extends, wherein the intermediate area is arranged in between the access area and the active area. The access area is an area in which the second polysilicon body is not present in the trenches. Instead, the first polysilicon body extends all the way to the top of the trench where it is electrically connected to a contact. Furthermore, in the intermediate area, thickness d1 may be greater than inside the active area.

The semiconductor device can be a shielded gate field-effect transistor, such as a shielded gate metal-oxide-semiconductor field-effect transistor, MOSFET, wherein the first polysilicon body forms a shielded gate for said transistor, wherein the second polysilicon body forms a gate for said transistor, and wherein a part of the second dielectric layer in between the second polysilicon body and the upper portion of the sidewall of the trench forms a gate oxide for said transistor. However, the present disclosure may equally be used in other high power switching devices, such as IGBTs.

The semiconductor body preferably comprises a silicon body although other semiconductor materials are not excluded.

BRIEF DESCRIPTION OF THE DRAWINGS

Next, the present disclosure will be described in more detail referring to the appended figures, wherein identical reference signs will be used to refer to identical or similar elements, and wherein.

DETAILED DESCRIPTION

Figure 2:
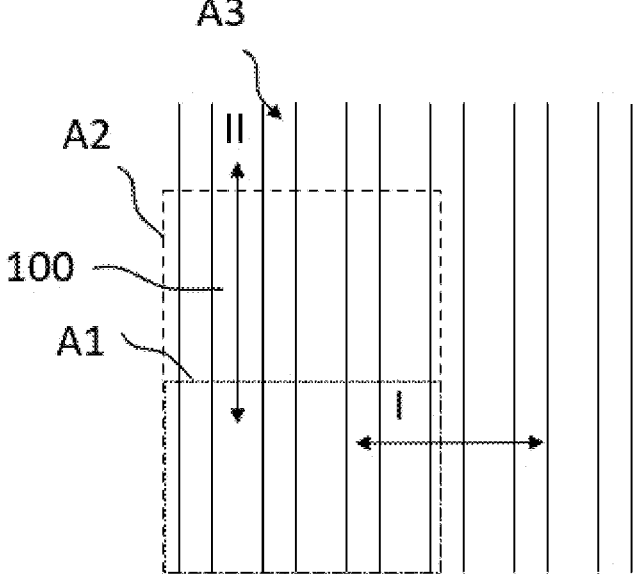
FIG. 2 illustrates a partial top view of a shielded-gate MOSFET in accordance with the present disclosure.
Figures 3A, 3B, 3C:
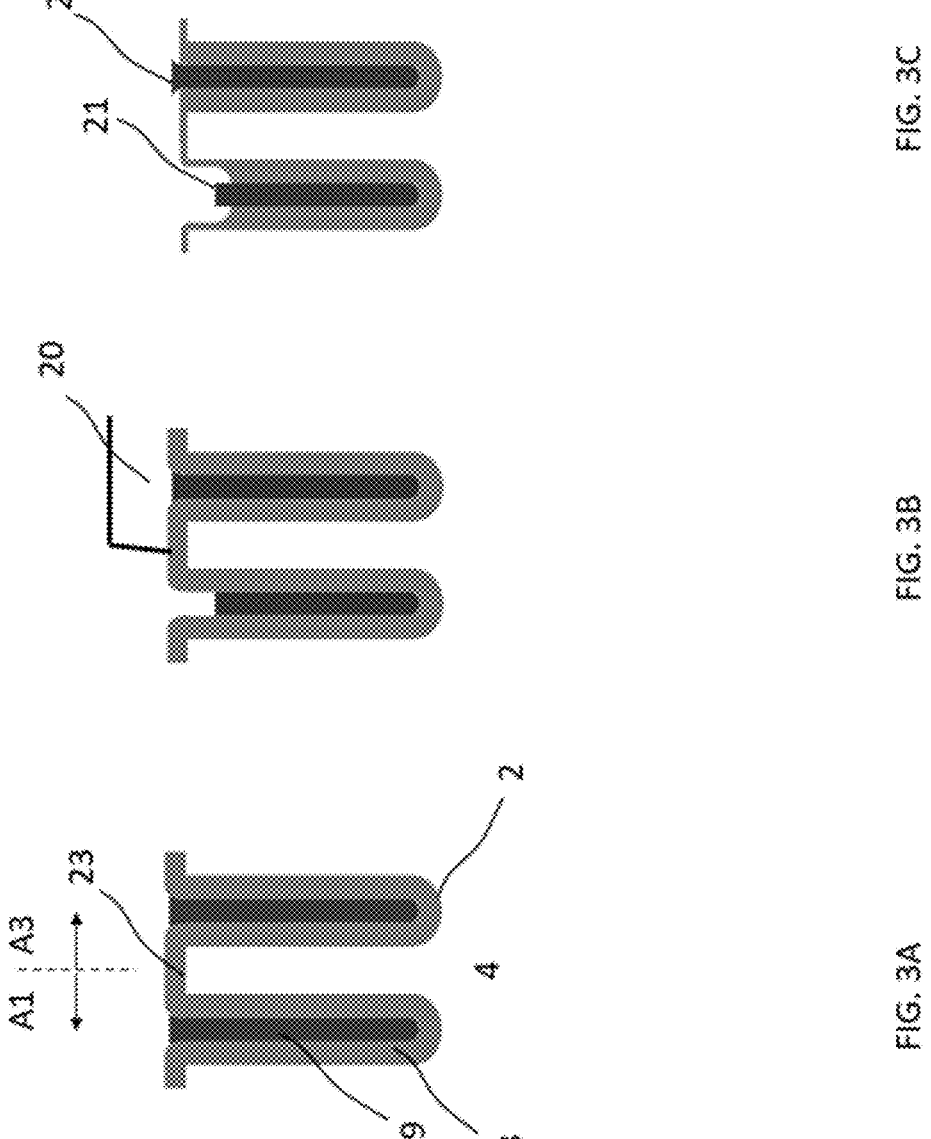
FIGS. 3A-3H illustrate a method of manufacturing a shielded-gate MOSFET in accordance with the present disclosure.
Figures 3D, 3E, 3F:
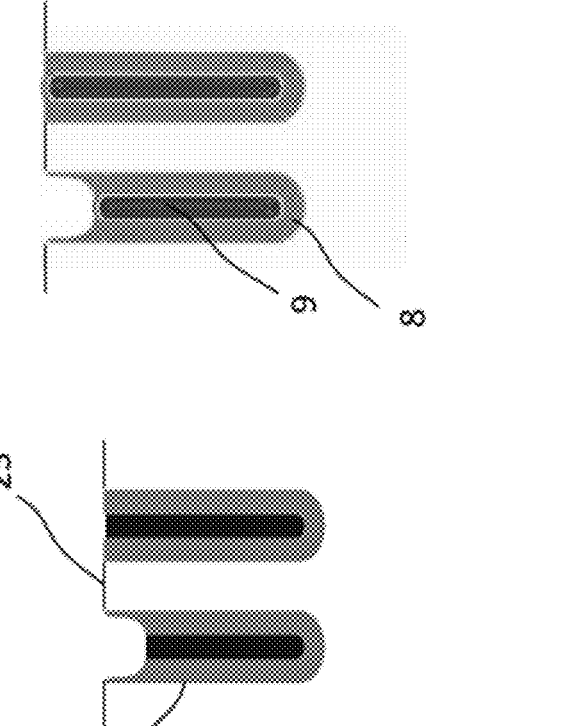
Figures 3G, 3H:
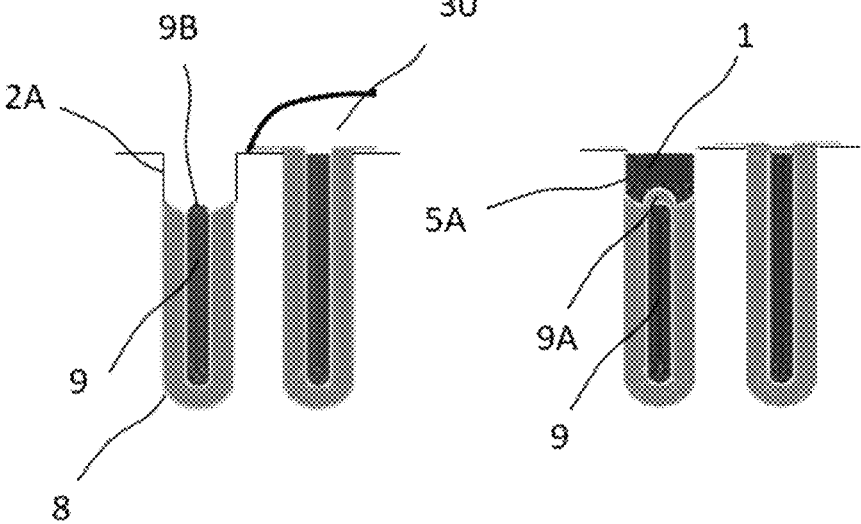

FIG. 2 illustrates a partial top view of a shielded-gate MOSFET in accordance with the present disclosure. In FIG. 2, a plurality of mutually separated trench structures 100 is schematically shown. The layout of the MOSFET can be divided in an active area A1, in which area the gate oxide and the second polysilicon body is provided, an access area A3, in which area the second polysilicon body is absent, and an intermediate area A2 in which the second polysilicon body is provided but in which the thickness of the second dielectric layer separating the first and second polysilicon bodies is greater than in the active area. FIG. 2 also illustrates two lines I, II, corresponding to cross-sectional views to be discussed in conjunction with FIGS. 3A-3H and FIGS. 4A-4B. More in particular, FIGS. 3A-3H correspond to line I, and FIGS. 4A-4B to line II. Consequently, FIGS. 3A-3H will display a trench corresponding to active area A1 next to a trench corresponding to access area A3, whereas FIG. 4A displays a cross section corresponding to a single trench extending from active area A1 to access area A3. FIG. 4B displays a detailed view of a trench inside active area A1 along the direction indicated by line I.

FIGS. 3A-3H illustrate a method of manufacturing a shielded-gate MOSFET in accordance with the present disclosure. This method will be discussed in conjunction with a silicon semiconductor body of which the structure is identical or similar to that shown in FIG. 1. More in particular, the semiconductor body may have a silicon substrate of a first charge type and an epitaxially grown silicon layer of the first charge type on top of the silicon substrate. Inside the epitaxially grown silicon layer a well may be formed of a second charge type different from the first charge type by means of ion implantation. Hereinafter, this well is referred to as the body region. Contact regions of the first charge type may be formed in or on top of the well of the second charge type. The first charge type may correspond to an n-type or to a p-type. It should be noted that the present disclosure is not limited to silicon semiconductor bodies. Different material types and/or epitaxial structures may be used.

Figure 1:
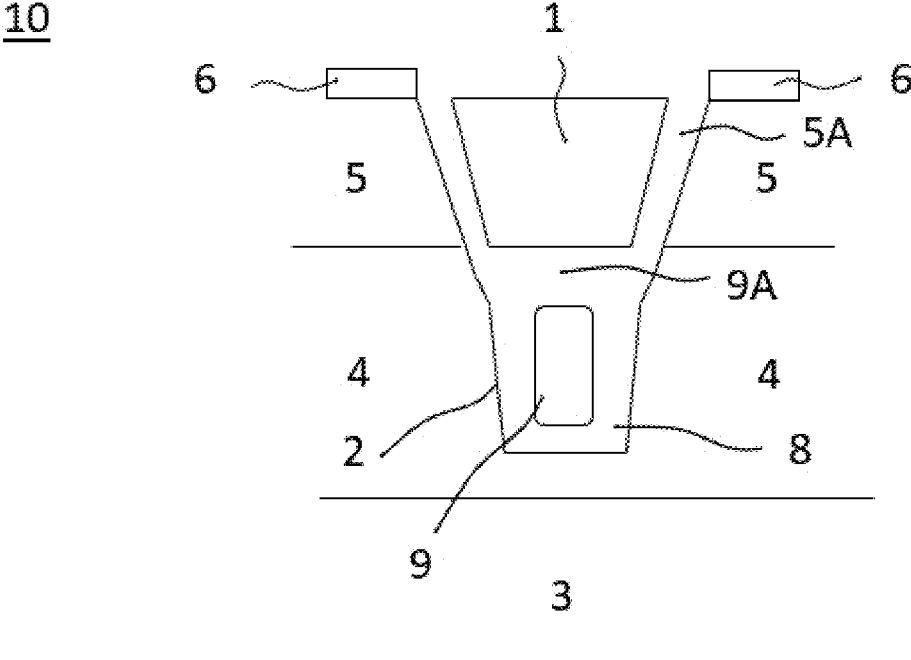
FIG. 1 illustrates a known shielded-gate MOSFET.

As a first step, a masking layer, such as photoresist, is provided on top of the silicon semiconductor body. The masking layer is opened at the positions where a trench is to be etched. After opening masking layer, a plurality of trenches 2 is etched into the semiconductor body, for example by means of a dry etching process. Generally, each trench 2 extends laterally through a respective body region as shown in FIG. 1. More in particular, active area A1 corresponds to an area in which a body region 4 is formed. Furthermore, each trench 2 extends in a depth direction through the body region into the drift region. After the etching step, the masking layer is removed and a thermal oxidation process is performed that oxidizes an upper surface 23 of the semiconductor body and an inside of trenches 2.

Once thermal oxide 8 has been formed, a first polysilicon body 9 is deposited on the semiconductor body, i.e. on upper surface 23 of the semiconductor body and inside trenches 2. The deposited first polysilicon body 9 is then etched back using chemical-mechanical polishing, CMP. As a final etching step, first polysilicon body 8 is lightly etched, e.g. using a wet-chemical etching process, to remove any residual polysilicon on upper surface 23 of the semiconductor body after performing CMP. After these steps, the situation shown in FIG. 3A is obtained.

As a next step, a masking layer 20, such as photoresist, is arranged on the semiconductor body. Masking layer 20 is opened in active area A1 allowing first polysilicon body 9 inside trenches 2 within active area A1 to be etched using an isotropic dry etching process. The depth of this etching determines to a large extent the gate length of the gates of the shielded-gate MOSFET. After this etching, the situation shown in FIG. 3B is obtained.

As a next step, a diluted HF or buffered HF solution can be used to reduce the thickness of thermal oxide 8. Prior to this etching step, masking layer 20 is removed. Consequently, upper ends 21, 22 of polysilicon body 9 in all trenches will be exposed. This is shown in FIG. 3C.

As a next step, first polysilicon body 9 is etched using a blanket etch. This etching step may comprise either an anisotropic or isotropic dry etching step. First polysilicon body 9 within access area A3 is aligned with upper surface 23 of the semiconductor body in between trenches 2 to avoid first polysilicon body 9 protruding above thermal oxide 8. This etching step also determines the height of first polysilicon body 9 inside trenches 2 within active area A1 as shown in FIG. 3D.

As a next step, thermal oxide 8 on upper surface 23 of the semiconductor body is etched using a dry etching process until upper surface 23 is exposed. This is shown in FIG. 3E. As a next step, first polysilicon body 9 in all trenches 2 is oxidized and thereafter an oxide deposition, e.g. using chemical vapor deposition, CVD, is performed. As shown in FIG. 3F, first polysilicon body 9 in all trenches 2 will consequently be rounded and oxide 8 will be thickened. Subsequent to the etching step, oxide 9 can be densified in a $N_2$ ambient.

As a next step, a masking layer 30 is arranged and patterned to expose active area A1. Oxide 8 in the area exposed by masking layer 30 is wet-etched until upper surface 23 of the semiconductor body and an upper portion of sidewall 2A of trenches 2 within active area A1 are exposed. As shown in FIG. 3G, this same etching step will cause upper ends 9B of first polysilicon body 9 in trenches 2 within active area A1 to protrude from the oxide inside these trenches. In addition, FIG. 3G indicates that within access area A3, the thermal oxide and CVD oxide formed in the previous step remain as they are protected by masking layer 30.

As a next step, masking layer 30 is removed and a gate oxide 5A is formed using a two-step etching process. First, a wet thermal oxidation is performed in a heated chamber during which etching process $O_2$ or an oxygen containing species, and $H_2$ or a hydrogen containing species are added. The addition of hydrogen causes the formation of water inside the heated chamber. During the wet thermal oxidation, a thermal oxide will grow on exposed first polysilicon body 9 inside trenches 2 within the active material at a higher rate than the growth of thermal oxide on the exposed upper portions of these trenches. After a predetermined amount of time, the supply of $H_2$ or hydrogen containing species is stopped and the thermal oxidation continues as a dry thermal oxidation. During this last step, the oxidation rates of the first polysilicon body 9 and the exposed upper portions of the sidewall of the trenches within the active area are more similar. By adjusting the etching times of the dry and wet thermal oxidation process, the thickness of the oxide 9A above first polysilicon body 9 and the thickness of the oxide 5A grown on the upper portion of the sidewall of the trenches within the active area can be individually controlled.

As a next step, a second polysilicon body 1 is deposited. Using a subsequent CMP step, only second polysilicon body 1 in the trenches 2 within active area A1 remains, as shown in FIG. 3H. Any residues outside of these trenches can be removed using a dry etching technique.

Figure 4A:
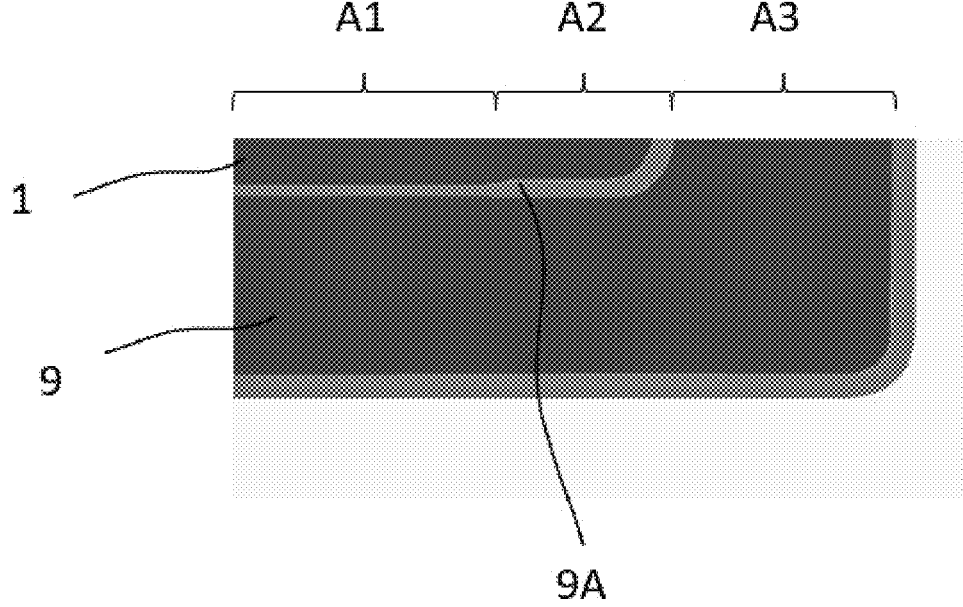
FIG. 4A schematically illustrates a cross-section corresponding to the top view of FIG. 2.
Figure 4B:
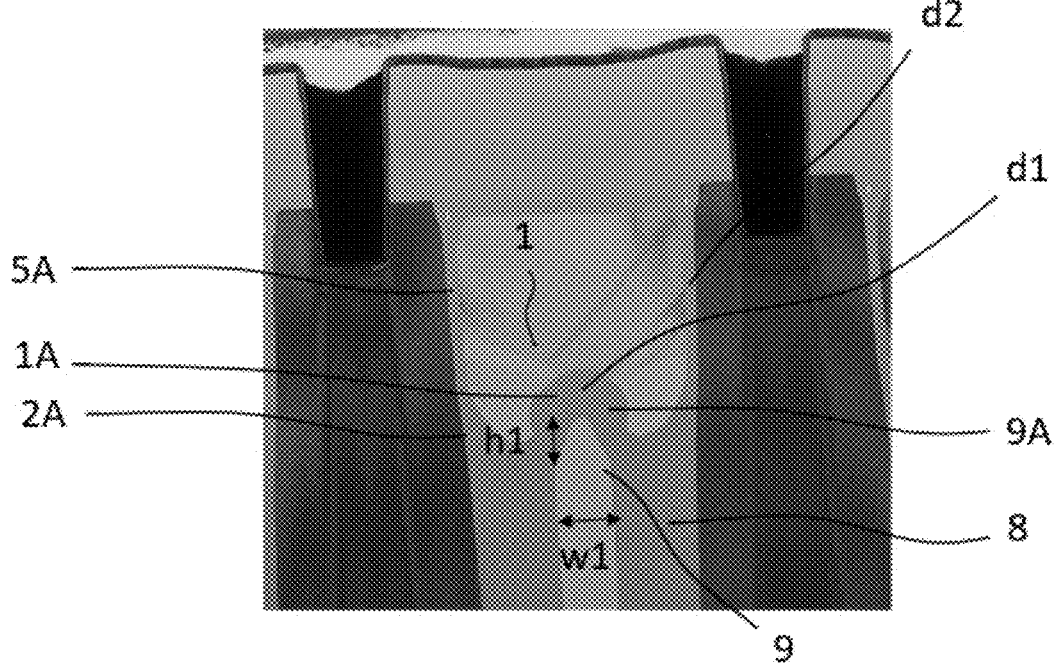
FIG. 4B illustrates a transmission electron microscopy, TEM, image of a trench structure in accordance with the present disclosure.

FIG. 4A schematically illustrates a cross-section along line II of FIG. 2. In this cross-sectional view, active area A1, intermediate area A2, and access area A3 can be distinguished. More in particular, when moving from active area A1 to intermediate area A2 a step in oxide thickness can be observed. This is due to the fact that the oxide-etch discussed in conjunction with FIG. 3F, i.e. for exposing the upper portion of the trenches within the active area, is not performed in intermediate area A2. Furthermore, access area A3 can be distinguished from active area A1 and intermediate area A2 because access area A3 does not comprise second polysilicon body 1. Typically, source region 6 and body region 5 are omitted in intermediate area A2 and access area A3. Inside intermediate area A2, a contact can be formed that connects to second polysilicon body 1. Inside access area A3, a contact can be formed that connects to first polysilicon body 9.

FIG. 4B illustrates a transmission electron microscopy, TEM, image of a trench structure in accordance with the present disclosure. As shown in FIG. 4B, the upper end of first polysilicon body 9 has a tapered form over a length h1 and protrudes into a recess 1A formed in second polysilicon body 1. The width of first polysilicon body 9, denoted by w1, complies with the requirement that h1/w1=1. Similarly, a thickness d1 of the second dielectric layer between the first and second silicon bodies 1, 9 is greater than a thickness d2 of the gate oxide between the second polysilicon body 1 and sidewall 2A.

In the above, the present disclosure has been explained using detailed embodiments thereof. However, the present disclosure is not limited to these embodiments.

Instead, various modifications are possible without departing from the scope of the present disclosure which is defined by the appended claims and their equivalents.

What is claimed is:

1. A semiconductor device comprising a plurality of mutually separated trench structures, each trench structure comprising:

an elongated trench formed in a semiconductor body;

wherein the elongated trench extends through an active area in the semiconductor body;

a first dielectric layer arranged on a bottom and a lower portion of a sidewall of the elongated trench;

a first polysilicon body arranged in the elongated trench and separated from the bottom and a sidewall of the elongated trench by the first dielectric layer;

a second dielectric layer arranged, within the active area, on an upper portion of the sidewall of the elongated trench, on the first polysilicon body, and on the first dielectric layer;

a second polysilicon body arranged, within the active area, in the elongated trench and separated from the sidewall of the elongated trench and from the first polysilicon body by the second dielectric layer;

wherein the second polysilicon body comprises an elongated recess extending along the elongated trench within the active area, the elongated recess being directed to the bottom of the elongated trench;

wherein the first polysilicon body has a tapered upper end that extends along the elongated trench within the active area and that partially extends in the elongated recess;

wherein a minimum thickness d1 of the second dielectric layer between the tapered upper end and the second polysilicon body is greater than a minimum thickness d2 of the second dielectric layer between the upper portion of the sidewall and the second polysilicon body;

wherein the semiconductor body comprises an access area and an intermediate area through which the elongated trench extends;

wherein the intermediate area is arranged in between the access area and the active area;

wherein, in the access area, the first polysilicon body fills the elongated trench and the second polysilicon body is absent, and wherein d1 is greater in the intermediate area than inside the active area.

2. The semiconductor device according to claim 1, wherein d1=a×d2, wherein a>2 and wherein d2 lies in a range between 0.02 and 0.2 micrometer.

3. The semiconductor device according to claim 1, wherein the first polysilicon body has a maximum width w1 in a direction perpendicular to a longitudinal axis of the elongated trench, wherein the tapered upper end has a height h1 in a depth direction of the elongated trench, wherein 0.3<w1/h1<3, and wherein width w1 lies in a range between 0.1 and 2 micrometers.

4. The semiconductor device according to claim 1, wherein the first dielectric layer and the second dielectric layer are both silicon oxide layers.

5. The semiconductor device according to claim 1, wherein the semiconductor device is a shielded gate field-effect transistor;

wherein the first polysilicon body forms a shielded gate for the transistor;

wherein the second polysilicon body forms a gate for the transistor; and wherein a part of the second dielectric layer in between the second polysilicon body and the upper portion of the sidewall of the elongated trench forms a gate oxide for the transistor.

6. The semiconductor device according to claim 1, wherein the semiconductor body comprises a silicon body.

7. The semiconductor device according to claim 1, wherein d2 lies in a range between 0.03 and 0.07 micrometer.

8. The semiconductor device according to claim 1, wherein d1=a×d2, wherein a>3 and wherein d2 lies in a range between 0.02 and 0.2 micrometer.

9. A method for manufacturing a semiconductor device comprising a plurality of mutually separated trench structures, the method comprising the steps of:

a) providing a plurality of spaced apart elongated trenches formed in a semiconductor body, each elongated trench extending through an active area in the semiconductor body;

wherein each elongated trench has a bottom and a lower portion of a sidewall covered by a first dielectric layer; and wherein for each elongated trench is a first polysilicon body that is arranged in the elongated trench;

wherein the first polysilicon body is separated from the bottom and the sidewall of the elongated trench by the first dielectric layer;

wherein for each elongated trench, an upper surface of the first polysilicon body and an upper portion of the sidewall are exposed;

b) performing a wet thermal oxidation for oxidizing the first polysilicon body and the exposed upper surface of the sidewall for forming, within the active area, a first part of a second dielectric layer and subsequently performing a dry thermal oxidation for forming a remaining part of the second dielectric layer;

c) arranging within the active area a second polysilicon body on the second dielectric layer in each elongated trench so that the second polysilicon body is separated from the sidewall of the elongated trench and from the first polysilicon body by the second dielectric layer;

wherein the semiconductor body comprises an access area and an intermediate area through which the plurality of elongated trenches extend, wherein the intermediate area is arranged in between the access area and the active area; and wherein the method further comprises forming the second dielectric layer so that a minimum thickness d1 of the second dielectric layer between a tapered upper end of the first polysilicon body and the second polysilicon body is greater than a minimum thickness d2 of the second dielectric layer between an upper portion of the sidewall of the elongated trench and the second polysilicon body;

wherein, in the access area, the elongated trench is formed so that the first polysilicon body fills the elongated trench and the second polysilicon body is absent, and wherein d1 is greater in the intermediate area than inside the active area.

10. The method according to claim 9, wherein during the wet oxidation of the first polysilicon body, an oxidation rate is at least 3 times greater than that of the exposed upper portion of the sidewall of the elongated trench.

11. The method according to claim 9, wherein performing step a) further comprises performing the steps of:

a1) providing the plurality of spaced apart elongated trenches so that the bottom and the sidewall of each elongated trench are covered by the first dielectric layer;

wherein for each elongated trench the first polysilicon body is arranged in the elongated trench, and the first polysilicon body is separated from the bottom and sidewall of the elongated trench by the first dielectric layer; and wherein for each elongated trench an upper surface of the first polysilicon body is exposed;

a2) performing thermal oxidation and subsequent deposition to round off the upper surface of the first polysilicon body thereby forming the tapered upper end of the first polysilicon body and thickening the first dielectric layer;

a3) arranging a first masking layer;

a4) opening the first masking layer within the active area;

a5) etching the first dielectric layer through the opened first masking layer so that the upper portion of the sidewall of each elongated trench becomes exposed and so that the tapered upper end of the first polysilicon body protrudes from the first dielectric layer.

12. The method according to claim 10, wherein performing step a) further comprises performing the steps of:

a1) providing the plurality of spaced apart elongated trenches so that the bottom and the sidewall of each elongated trench are covered by the first dielectric layer;

wherein for each elongated trench the first polysilicon body is arranged in the elongated trench, and the first polysilicon body is separated from the bottom and sidewall of the elongated trench by the first dielectric layer; and wherein for each elongated trench, an upper surface of the first polysilicon body is exposed;

a2) performing thermal oxidation and subsequent deposition to round off the upper surface of the first polysilicon body thereby forming the tapered upper end of the first polysilicon body and thickening the first dielectric layer;

a3) arranging a first masking layer;

a4) opening the first masking layer within the active area;

a5) etching the first dielectric layer through the opened first masking layer so that the upper portion of the sidewall of each elongated trench becomes exposed and so that the tapered upper end of the first polysilicon body protrudes from the first dielectric layer.

13. The method according to claim 11, wherein the etching under step a5) is performed so that after having completed steps b) and c) a recess is formed in the second polysilicon body in which the upper and of the first polysilicon body protrudes.

14. The method according to claim 11, wherein the step a1) further comprises:

a11) providing the plurality of spaced apart elongated trenches so that the bottom and the sidewall of each elongated trench and an upper surface of the semiconductor body are covered by the first dielectric layer; and a12) etching the first dielectric layer to expose the upper surface of the semiconductor body.

15. The method according to claim 13, wherein the step a1) further comprises:

a11) providing the plurality of spaced apart elongated trenches so that the bottom and the sidewall of each elongated trench and an upper surface of the semiconductor body are covered by the first dielectric layer; and a12) etching the first dielectric layer to expose the upper surface of the semiconductor body.

16. The method according to claim 14, wherein the semiconductor body comprises an access area and an intermediate area through which the plurality of elongated trenches extend;

wherein the intermediate area is arranged in between the access area and the active area, and wherein the step a11) further comprises:

a111) providing the plurality of spaced apart elongated trenches so that the bottom and the sidewall of each elongated trench and an upper surface of the semiconductor body are covered by the first dielectric layer and wherein the first polysilicon body fills the elongated trench;

a112) providing a second masking layer;

a113) patterning the second masking layer so that the second masking layer covers those elongated trenches among the plurality of elongated trenches that are arranged in an access area, and so that the second masking layer exposes those elongated trenches among the plurality of elongated trenches that are arranged in the active area;

a114) partially etching the first polysilicon body in the plurality of elongated trenches through the opened second masking layer;

a115) partially etching, the first dielectric layer so that the tapered upper end of the first polysilicon body protrudes from the first dielectric layer;

a116) etching the first polysilicon body.

17. The method according to claim 16, wherein step a114) is performed so that after the etching, the first polysilicon body inside the intermediate area varies from a level corresponding to that of the first polysilicon body inside the active area to a level corresponding to that of the first polysilicon body inside the access area.

18. The method according to claim 16, wherein step a116) is performed so that after the etching, the first polysilicon body within the active area lies leveled with the first dielectric layer, and so that after the etching, the first polysilicon body within the access area lies in plane with the upper surface of the semiconductor body.

19. The method according to claim 17, wherein step a116) is performed so that after the etching, the first polysilicon body within the active area lies leveled with the first dielectric layer, and so that after the etching, the first polysilicon body within the access area lies in plane with the upper surface of the semiconductor body.

* * * * *